(12) United States Patent
Van De Ven et al.

(10) Patent No.: US 8,491,140 B2
(45) Date of Patent: Jul. 23, 2013

(54) LIGHTING DEVICE WITH MULTIPLE EMITTERS AND REMOTE LUMIPHOR

(75) Inventors: Antony Paul Van De Ven, Hong Kong (CN); Paul Kenneth Pickard, Morrisville, NC (US); Gerald H. Negley, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 378 days.

(21) Appl. No.: 12/941,014

(22) Filed: Nov. 5, 2010

(65) Prior Publication Data

US 2012/0112661 A1    May 10, 2012

(51) Int. Cl.
*F21V 9/16*    (2006.01)

(52) U.S. Cl.
USPC .......... 362/84; 362/231; 362/249.02; 257/98; 313/498

(58) Field of Classification Search
USPC ................ 362/84, 231, 230, 240, 34, 249.02, 362/800; 257/98; 313/498
See application file for complete search history.

(56) References Cited

U.S. PATENT DOCUMENTS

| | | | | |
|---|---|---|---|---|
| 6,234,648 | B1 * | 5/2001 | Borner et al. ................. | 362/235 |
| 7,005,679 | B2 * | 2/2006 | Tarsa et al. ....................... | 257/89 |
| 7,029,935 | B2 | 4/2006 | Negley et al. | |
| 7,042,020 | B2 | 5/2006 | Negley | |
| 7,070,300 | B2 | 7/2006 | Harbers et al. | |
| 7,144,131 | B2 * | 12/2006 | Rains ............................. | 362/231 |
| 7,456,499 | B2 | 11/2008 | Loh et al. | |
| 7,564,180 | B2 | 7/2009 | Brandes | |
| 7,614,759 | B2 | 11/2009 | Negley | |
| 7,758,214 | B2 | 7/2010 | Lee et al. | |
| 7,799,586 | B2 | 9/2010 | Leung et al. | |
| 7,810,947 | B2 * | 10/2010 | Ueno et al. .................... | 362/231 |
| 7,828,459 | B2 * | 11/2010 | Rains ............................ | 362/231 |
| 8,337,030 | B2 * | 12/2012 | Pickard .......................... | 362/84 |

(Continued)

FOREIGN PATENT DOCUMENTS

| | | |
|---|---|---|
| JP | 2000-250032 A | 9/2000 |
| JP | 2002-094129 A | 3/2002 |

(Continued)

OTHER PUBLICATIONS

Co-pending U.S. Appl. No. 12/905,054, filed Oct. 14, 2010.

(Continued)

*Primary Examiner* — Bao Q Truong
(74) *Attorney, Agent, or Firm* — Vincent K. Gustafson; Jenkins, Wilson, Taylor & Hunt, P.A.

(57) ABSTRACT

A lighting device including a plurality of electrically activated emitters having different peak wavelengths, at least one remote lumiphor arranged to receive at least some emissions from one of the emitters, and a primary electrically activated emitter spatially segregated and/or thermally insulated from a secondary electrically activated emitter. A lighting device including a plurality of electrically activated emitters spatially segregated from one another having different peak wavelengths, at least one lumiphor spatially segregated from one of the emitters, and a control device independently connected to each emitter or group of emitters. A method of producing a lighting device including a plurality of independently controllable electrically activated emitters.

72 Claims, 5 Drawing Sheets

U.S. PATENT DOCUMENTS

| | | |
|---|---|---|
| 2004/0218387 A1 | 11/2004 | Gerlach |
| 2005/0093430 A1 | 5/2005 | Ibbetson et al. |
| 2007/0063321 A1 | 3/2007 | Han et al. |
| 2007/0170447 A1 | 7/2007 | Negley et al. |
| 2007/0223219 A1 | 9/2007 | Medendorp, Jr. et al. |
| 2007/0240346 A1 | 10/2007 | Li et al. |
| 2008/0029720 A1 | 2/2008 | Li |
| 2008/0192458 A1 | 8/2008 | Li |
| 2008/0218992 A1 | 9/2008 | Li |
| 2008/0218993 A1 | 9/2008 | Li |
| 2009/0008573 A1 | 1/2009 | Conner |
| 2009/0050908 A1 | 2/2009 | Yuan et al. |
| 2009/0207583 A1 * | 8/2009 | Takano ............................ 362/84 |
| 2009/0250710 A1 | 10/2009 | Negley |
| 2010/0027293 A1 | 2/2010 | Li |
| 2010/0177509 A1 | 7/2010 | Pickard |

FOREIGN PATENT DOCUMENTS

| | | |
|---|---|---|
| JP | 2004-071726 A | 3/2004 |
| JP | 2007-258620 A | 10/2007 |
| JP | 2009-238734 A | 10/2009 |
| KR | 10-0951781 B1 | 4/2010 |
| WO | 2010/117157 A2 | 10/2010 |

OTHER PUBLICATIONS

Co-pending U.S. Appl. No. 12/941,012, filed Nov. 5, 2010.
International Search Report for International Patent Application No. PCT/US2011/054182 dated Apr. 23, 2012.

* cited by examiner

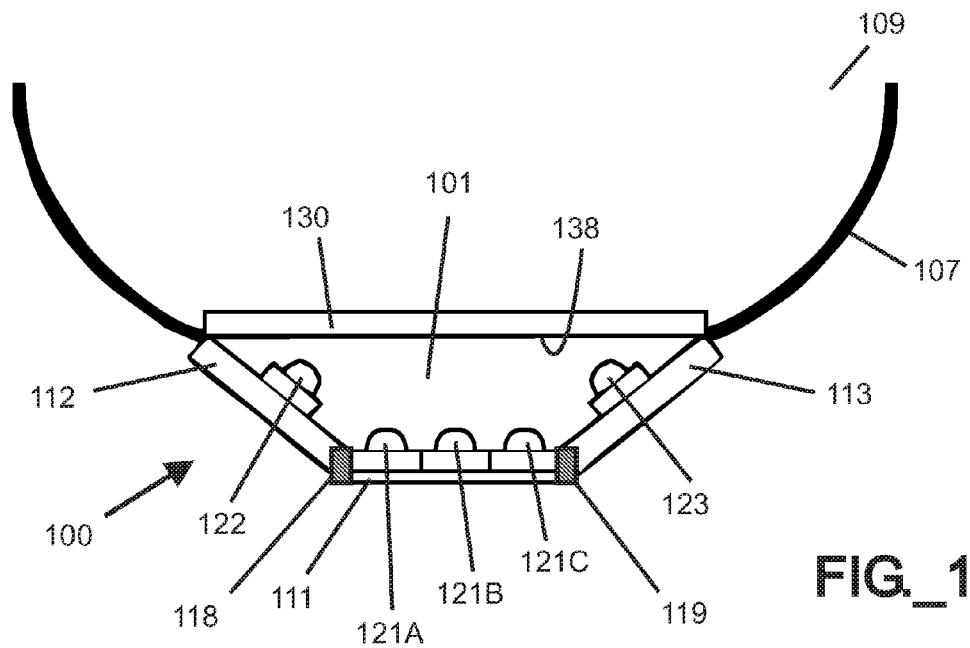
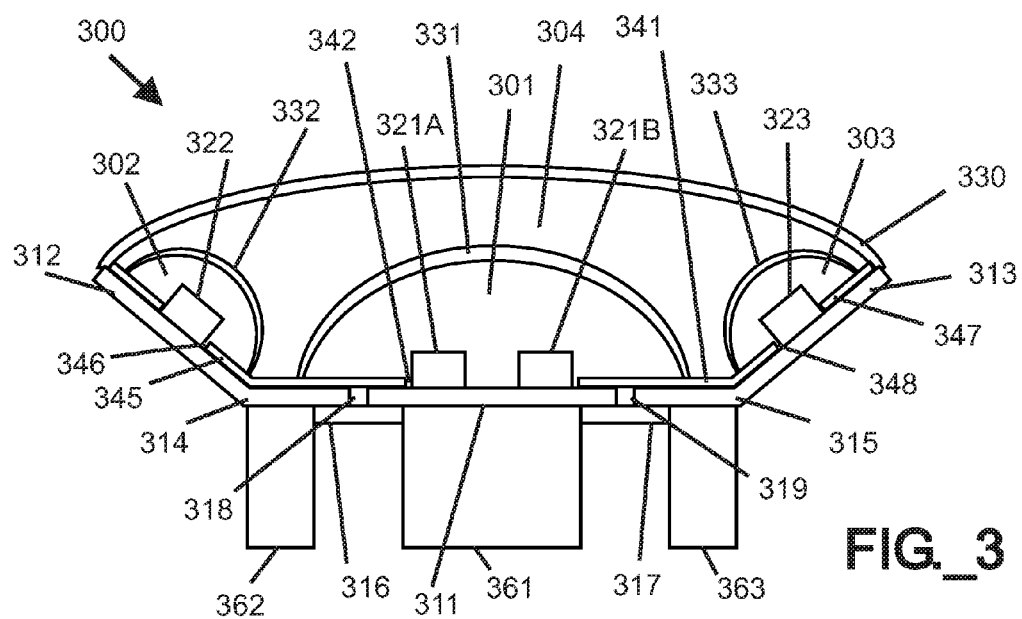

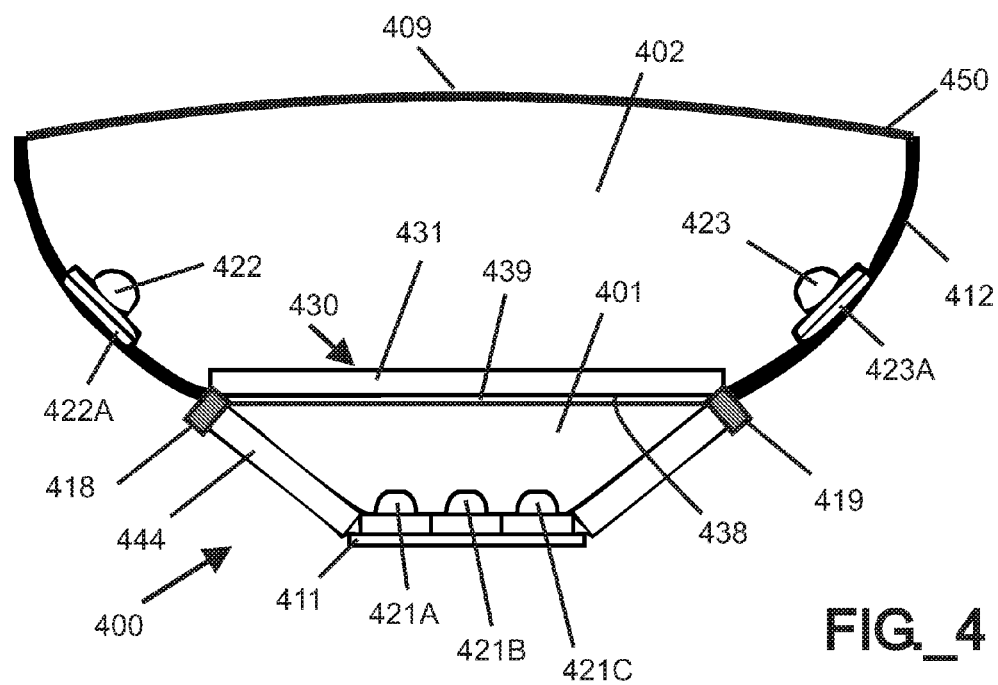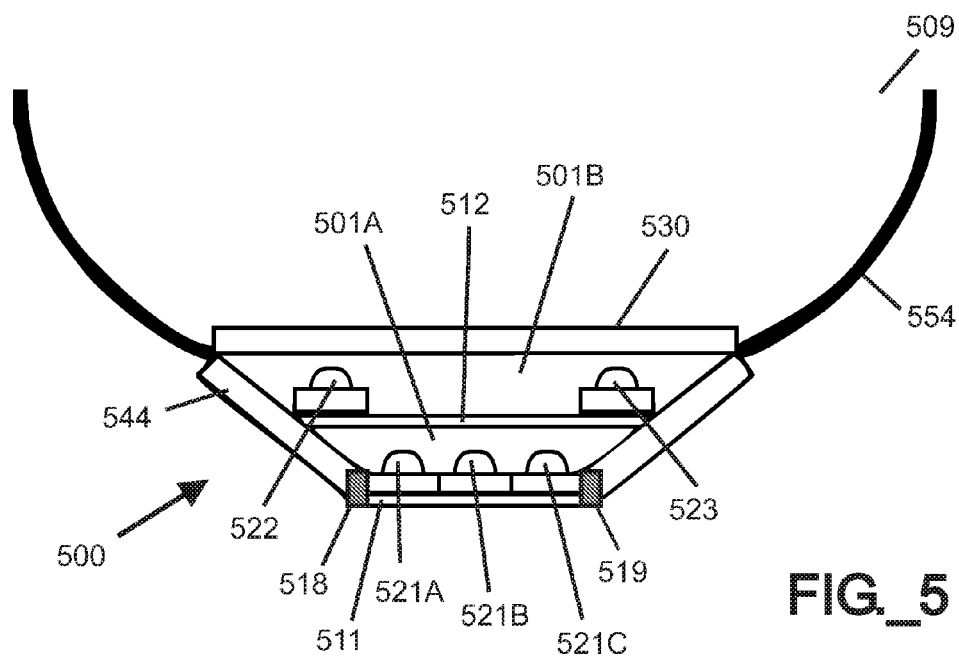

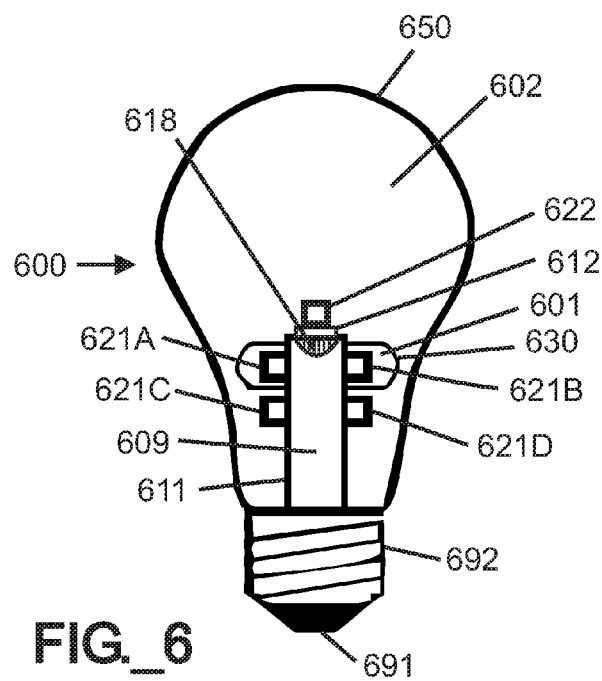
FIG._6
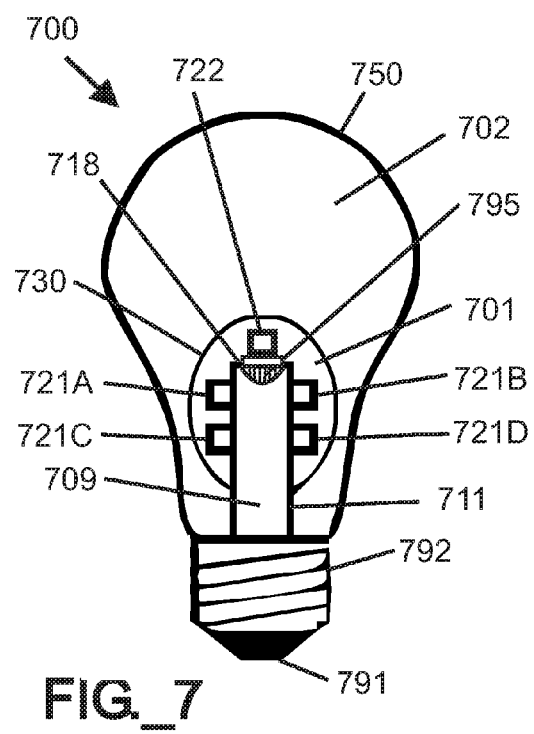
FIG._7

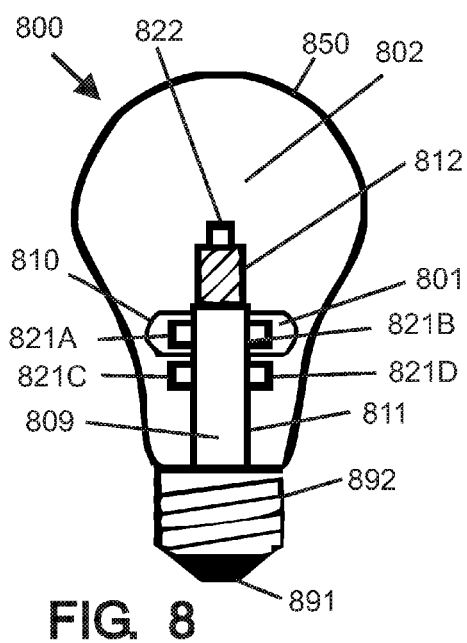
FIG._8
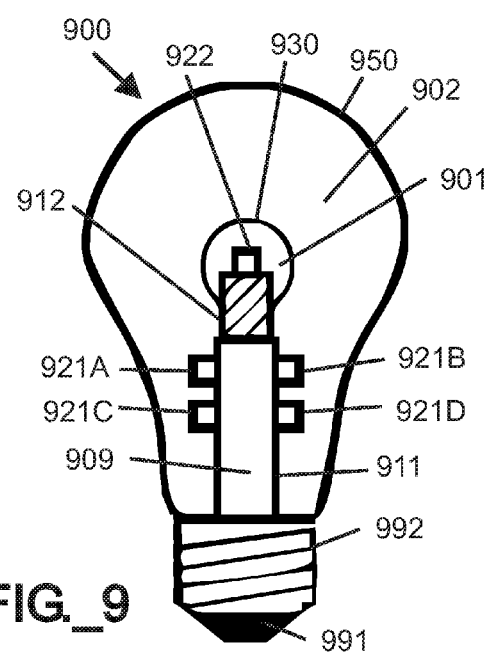
FIG._9

LIGHTING DEVICE WITH MULTIPLE EMITTERS AND REMOTE LUMIPHOR

TECHNICAL FIELD

The present invention relates generally to lighting devices and associated structures for managing heat generated by lighting devices, and methods relating to same.

BACKGROUND

Lumiphors (also known as lumiphoric materials) are commonly used with electrically activated emitters to produce a variety of emissions such as colored (e.g., non-white) or white light (e.g., perceived as being white or near-white). Electrically activated emitters may be utilized to provide white light (e.g., perceived as being white or near-white), and have been investigated as potential replacements for white incandescent lamps. Such emitters may have associated filters that alter the color of the light and/or include lumiphors that absorb a portion of emissions having a first peak wavelength emitted by the emitter and re-emit the light having a second peak wavelength that differs from the first peak wavelength. Phosphors, scintillators, and lumiphoric inks are common lumiphors. Light perceived as white or near-white may be generated by a combination of red, green, and blue (RGB) emitters, or, alternatively, by combined emissions of a blue light emitting diode (LED) and a lumiphor such as a yellow phosphor. In the latter case, a portion of emissions from the blue LED passes through the phosphor, while another portion of the blue LED emissions is absorbed by the phosphor and downconverted to yellow emissions, and the resulting combination of blue and yellow light is perceived as white. Another approach for producing white light is to stimulate phosphors or dyes of multiple colors with a violet or ultraviolet LED source.

LEDs (including both organic and inorganic light emitting diodes) are electrically activated emitters that convert electric energy to light, and generally include one or more active layers of semiconductor material adjacent to doped layers. When bias is applied across doped layers, holes and electrons are injected into one or more active layers, where they recombine to generate light that is emitted from the device. Laser diodes are solid state emitters that operate according to similar principles.

A representative example of a white LED lamp includes a package of a blue LED chip (e.g., made of InGaN and/or GaN) combined with a lumiphor such as a phosphor (typically YAG:Ce) that absorbs at least a portion of the blue light (first peak wavelength) and re-emits yellow light (second peak wavelength), with the combined yellow and blue emissions providing light that is perceived as white or near-white in character. If the combined yellow and blue light is perceived as yellow or green, it can be referred to as 'blue shifted yellow' ("BSY") light or 'blue shifted green' ("BSG") light. Addition of red spectral output from an emitter or lumiphor may be used to increase the warmth of the aggregated light output. The addition of one or more red LEDs (e.g., (Al,In, Ga)P-based) to a blue (e.g., GaN-based) LED-based (e.g., BSY) lighting device improves color rendering and better approximates light produced by incandescent lamps. Emitters or lumiphors of other colors may be used, such as disclosed in U.S. Patent Application Publication No. 2007/0223219 to Medendorp, Jr., et al. As indicated previously, it is known to supplement emissions from primary blue LEDs and yellow phosphors with red spectral output, such as may be generated by supplemental red LEDs or red phosphors. Use of red LEDs is often preferable to use of red phosphors in such context, such as to promote greater efficacy and/or controllability. The use of red supplemental LEDs in combination with high-power primary blue LEDs, however, creates additional problems. Red LEDs include active regions typically formed of (Periodic Table) Group III phosphide (e.g., (Al,In,Ga)P) material, in contrast to blue LEDs, which include active regions typically are formed of Group III nitride materials (e.g., represented as (Al,In,Ga)N, including but not limited to GaN). Although luminous efficiency varies with respect to temperature for LEDs of all materials, the efficiency if Group III phosphide based solid state emitters declines at a greater rate than Group III nitride based solid emitters at elevated temperatures. In devices including both red and blue LEDs, heat emanating from the blue LEDs will increase the temperature of the red LEDs. To maintain a relatively constant color point utilizing a device including a Group III-nitride-based blue LED (e.g., as part of a BSY emitter) and Group III-phosphide based red LED, ratio of currents supplied to the red LEDs relative to the blue LEDs must be altered (i.e., increased) as temperature increases because of the different temperature responses of the blue and red LEDs. Ultimately, reduction of luminous efficiency of red LEDs results in reduction in total flux from the combination of emitters at a desired color point, or results in a lack of control of color point at higher flux values, thereby limiting utility of the device.

Many modern lighting applications require high power emitters to provide a desired level of brightness. High power emitters can draw large currents, thereby generating significant amounts of heat. Limitations associated with binding a lumiphor (e.g., phosphor) to an emitter surface generally restrict the total amount of radiance that can be applied. Lumiphor binding materials and/or lumiphors tend to change color (e.g., darken) after extended periods of exposure to elevated temperatures. In order to increase reliability and prolong useful service life of a lighting device including a lumiphor, the lumiphor may be physically separated from an electrically activated emitter. Separation of the lumiphor element permits the electrically activated emitter to be driven with higher current and thereby produce a higher radiance without excessively heating the lumiphor element. Although various lighting devices utilizing remote lumiphors are known (e.g., such as disclosed in U.S. Patent Application Publication No. 2005/0270775), such devices typically have limited color rendering ability and/or limited tenability to achieve a desired color point.

Another difficulty associated with use of multiple emitters of different colors is achieving desirable uniformity of color of the aggregated emissions therefrom, without unduly reducing total flux of the resulting emissions.

In consequence, the art continues to seek improvements in light emitting devices that include many of the advantages associated with use of high output emitters, but which also have the capacity to produce warmer light and improved color rendering at high flux. It would also be desirable to provide tunabilty of the color and chromaticity of light emitted by a light emitting device.

SUMMARY

The present invention relates generally to high output lighting devices with multiple electrically activated emitters and at least one lumiphor that is remotely located from such emitters, and with multiple emitter support elements arranged to reduce conductive heat transfer between different electrically activated emitters.

A first aspect of the invention relates to a lighting device comprising: a plurality of electrically activated emitters including at least one first electrically activated emitter having a first peak wavelength, and at least one second electrically activated emitter having a second peak wavelength, wherein the first peak wavelength differs from the second peak wavelength; a first emitter support element arranged to support the at least one first electrically activated emitter; a first lumiphor spatially segregated from and arranged to receive emissions from the at least one first electrically activated emitter; a second emitter support element arranged to support the at least one second electrically activated emitter, wherein the second emitter support element is spatially segregated from, and/or is in insubstantial thermally conductive communication with, the first emitter support element; a second lumiphor spatially segregated from and arranged to receive emissions from the at least one second electrically activated emitter; and at least one of (i) a common reflector and (ii) a common diffuser, arranged to receive at least some emissions from each emitter of the plurality of electrically activated emitters.

A second aspect of the invention relates to a lighting device comprising: a plurality of electrically activated emitters including at least one first electrically activated emitter having a first peak wavelength, and at least one second electrically activated emitter having a second peak wavelength, wherein the first peak wavelength differs from the second peak wavelength; a first emitter support element arranged to support the at least one first electrically activated emitter; a first lumiphor spatially segregated from and arranged to receive emissions from the at least one first electrically activated emitter; a second emitter support element arranged to support the at least one second electrically activated emitter, wherein the second emitter support element is spatially segregated from, and/or is in insubstantial thermally conductive communication with, the first emitter support element; a second lumiphor spatially segregated from and arranged to receive emissions from the at least one second electrically activated emitter; and at least one of (i) a common reflector and (ii) a common diffuser, arranged to receive at least some emissions from each emitter of the plurality of electrically activated emitters.

A third aspect of the invention relates to a method of fabricating a lighting device, the method comprising: connecting a first emitter support element and a second emitter support element via at least one thermally insulating material to form a subassembly wherein at least a portion of each of the first emitter support element and the second emitter support element is substantially coplanar; applying at least one of a patterning step, a deposition step, and a soldering step to the at least a portion of the subassembly; and performing at least one of a bending operation and a shaping operation to the subassembly to cause at least a portion of the second emitter support element to be non-coplanar with the first emitter support element.

In another aspect, any of the foregoing aspects, and/or various separate aspects and features as described herein, may be combined for additional advantage.

Other aspects, features and embodiments of the invention will be more fully apparent from the ensuing disclosure and appended claims.

BRIEF DESCRIPTION OF THE DRAWINGS

FIG. 1 is a cross-sectional schematic view of at least a portion of a lighting device including a lumiphor arranged over and spatially segregated from multiple electrically activated emitters, with a first group of electrically activated emitters arranged on a first emitter support element, and with a second group of electrically activated emitters arranged on a second emitter support element associated with an angled reflector wall.

FIG. 3 is a schematic side cross-sectional view of at least a portion of a lighting device including a first lumiphor arranged over and spatially segregated from a first group of electrically activated emitters supported by a first emitter support element to emit light toward a first remote lumiphor, including a second lumiphor arranged over and spatially segregated from a second electrically activated emitter supported by a second emitter support element, and including a third lumiphor arranged over and spatially segregated from a third electrically activated emitter supported by a third emitter support element.

FIG. 4 is a side cross-sectional schematic view of a lighting device including a lumiphor arranged over and spatially segregated from a first group of electrically activated emitters supported by a first emitter support element, and including a second group of electrically activated emitters arranged on a second emitter support element associated with a reflector extending beyond the lumiphor.

FIG. 5 is a side cross-sectional schematic view of a lighting device including a lumiphor arranged over and spatially segregated from (i) a first group of electrically activated emitters supported by a first emitter support element and (ii) a second group of electrically activated emitters supported by a second emitter support element.

FIG. 6 is a schematic side elevation view of a light bulb including a first emitter support element forming a tubular shape and supporting a group of electrically activated emitters, and including a second emitter support element extending through an interior of the tubular shape, with a spatially segregated lumiphor arranged to receive emissions from a subset of emitters supported by the first emitter support element.

FIG. 7 is a schematic side elevation view of a light bulb including a first emitter support element forming a tubular shape and supporting a group of electrically activated emitters, and including a second emitter support element extending through an interior of the tubular shape, with a spatially segregated lumiphor arranged to receive emissions from all emitters supported by the first and the second emitter support element.

FIG. 8 is a schematic side elevation view of a light bulb including a first emitter support element supporting a group of electrically activated emitters, and including a second emitter support element including a thermal insulator stacked over the first emitter support element and supporting another electrically activated emitter, with a spatially segregated lumiphor arranged to receive emissions from a subset of emitters supported by the first emitter support element.

FIG. 9 is a schematic side elevation view of a light bulb including a first emitter support element supporting a group of electrically activated emitters, and including a second emitter support element including a thermal insulator stacked over the first emitter support element and supporting another electrically activated emitter, with a spatially segregated lumiphor arranged to receive emissions from the emitters supported by the second emitter support element.

DETAILED DESCRIPTION

Figure 2A:
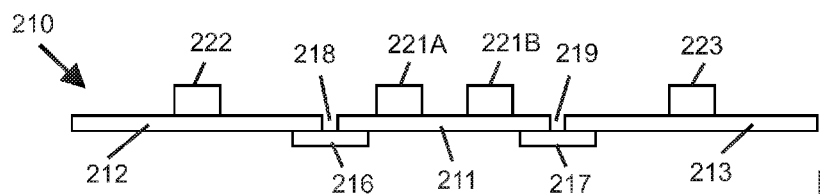
FIG. 2A is schematic side cross-sectional view of a subassembly of a lighting device in a first state of manufacture, including a first group of electrically activated emitters arranged on a first emitter support element, and second and third electrically activated emitters arranged on second and third emitter support element.

The present invention now will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey the scope of the invention to those skilled in the art. In the figures, the size and relative sizes of layers and regions may be exaggerated for clarity.

Unless otherwise defined, terms (including technical and scientific terms) used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Unless the absence of one or more elements is specifically recited, the terms "comprising," "including," and "having" as used herein should be interpreted as open-ended terms that do not preclude the presence of one or more elements.

The terms "electrically activated emitter" and "emitter" as used herein refers to any device capable of producing visible or near visible (e.g., from infrared to ultraviolet) wavelength radiation, including but not limited to, xenon lamps, mercury lamps, sodium lamps, incandescent lamps, and solid state emitters, including diodes (LEDs), organic light emitting diodes (OLEDs), and lasers. Various types of electrically activated emitters generate steady state thermal loads upon application thereto of an operating current and voltage. In the case of solid state emitters, such steady state thermal load and operating current and voltage are understood to correspond to operation of the solid state emitter at a level that maximizes emissive output at an appropriately long operating life (preferably at least about 5000 hours, more preferably at least about 10,000 hours, more preferably still at least about 20,000 hours).

Electrically activated emitters may be used individually or in combination with one or more lumiphors (e.g., phosphors, scintillators, lumiphoric inks) to generate light having one or more peak wavelengths and/or desired colors, including combinations of colors that may be perceived as white. Inclusion of lumiphoric (also called 'luminescent') materials in lighting devices as described herein may be accomplished by adding such materials to encapsulants, adding such materials to lenses, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element.

Various embodiments relate generally to high output lighting devices with multiple electrically activated emitters and at least one lumiphor that is remotely located from such emitters, and with multiple emitter support elements arranged to reduce conductive heat transfer between different electrically activated emitters. In certain embodiments as disclosed herein, a first emitter support element is arranged to support at least one first electrically activated emitter having a first peak wavelength, a second emitter support element is arranged to support at least one second electrically activated emitter having a second peak wavelength, and at least one lumiphor is segregated from and arranged to receive emissions from the at least one of the electrically activated emitters, wherein the second emitter support element is spatially segregated from, and/or is in insubstantial thermally conductive communication with, the first emitter support element. Additional electrically activated emitters and/or lumiphors may be provided. In one embodiment, a lighting device includes different electrically activated emitters (e.g., LEDs) having peak emissions in the red, green, and blue wavelength ranges (optionally accompanied by another electrically activated emitter having peak emissions in the blue wavelength range combined with a yellow lumiphor to create BSY or 'white' emissions) with independent control of each electrically activated emitter. At least one of a common reflector and a common diffuser, arranged to receive at least some emissions from each electrically activated emitter, is preferably provided. In one embodiment, one or more lumiphors are arranged to receive emissions from multiple electrically activated emitters of different colors, with such lumiphor(s) also providing light diffusing and/or light mixing utility.

In certain embodiments, spatial segregation (e.g., as applied to lumiphors that are spatially segregated from electrically activated emitters, or as applied to multiple emitter support elements that are spatially segregated relative to one another) may involve separation of a distance of preferably at least about 1 mm, more preferably at least about 2 mm, more preferably at least about 5 mm, and more preferably at least about 10 mm. In certain embodiments, conductive thermal communication between a spatially segregated lumiphor and one or more electrically activated emitters is not substantial, and conductive thermal communication between a spatially segregated emitter support element and one or more electrically activated emitters is not substantial. Conductive thermal communication between elements may be reduced by separation and/or by use of one or more interposing thermally insulating materials. A body structure connecting multiple emitter support elements may be formed with thermally insulating materials arranged between emitter support elements, and thermally conducting materials forming or arranged to receive heatsinks for dissipation of heat from electrically activated emitters and associated emitter support elements. A first heatsink may be arranged in conductive thermal communication with a first emitter support element, and a second heatsink may be arranged in conductive thermal communication with a second emitter support element.

Spatial segregation (and/or other arrangement including use of interposing thermally insulating materials, preferably resulting in limited or insubstantial conductive thermal communication) between at least one lumiphor and a primary electrically activated emitter is desirable to reduce heating of a lumiphor and/or associated lumiphor binding material. Such reduction in heating reduces or slows the color shift of a lumiphor element, thereby enhancing stability and longevity of the at least one lumiphor, and permitting associated electrically activated emitters to be driven at a higher current, thereby generating higher flux and increasing utility of a lighting device. In one embodiment, a thermally insulating material is provided between different emitter support elements.

By providing electrically activated emitters supported by different emitter support elements that are spatially segregated from and/or is in limited or insubstantial thermally conductive communication with one another, conductive thermal communication between different emitters is reduced or eliminated. Such arrangement permits different electrically operated emitters within the same lighting device to operate at different temperatures, thereby mitigating color shift problems that often result when solid state emitters of different material types (e.g., GaN-based blue LEDs and AlInGaP-based red LEDs) are operated in the same device, since luminous efficiency of certain electrically activated emitters (e.g., AlInGaP-based red LEDs) declines more rapidly as a function of increasing temperature than other emitters. Such arrangement also enables greater flux from the combined emitters at a desired color point, thereby increasing utility of a lighting device.

An emitter support element may support (e.g., provide structural support for) an electrically activated emitter either directly (e.g., with an electrically activated emitter mounted directly thereon) or indirectly (e.g., with one or more interposing elements such as bonding pads, submounts, heat spreaders, etc.). In one embodiment, an emitter support element comprises a printed circuit board (PCB), such as a metal core printed circuit board (MCPCB). A MCPCB may be desirably employed to provide both electrical connections (e.g., electrical traces) and thermal connection to one or more electrically activated emitters, with at least one heat spreader, heatsink, or other heat conducting device preferably being in conductive thermal communication with the electrically activated emitter through the MCPCB. MCPCB may include multiple electrically conductive surfaces and/or layers with connecting vias extending between respective layers and/or surfaces.

Lumiphors may be supported on or within one or more lumiphor support elements, such as (but not limited to) glass layers or discs, optical elements, or layers of similarly substantially translucent or substantially transparent materials capable of being coated with or embedded with lumiphor materials. Lumiphors may be provided in the form of particles films, or sheets. In one embodiment, a lumiphor (e.g., phosphor) is embedded or otherwise dispersed in a body of the lumiphor support element. If a lumiphor is arranged within a lumiphor support element, then lumiphor emissions may be subject to at least partial reflection by (or between) inner and outer surfaces of the lumiphor support element. Anti-reflective coatings or materials may be provided on the inner and/or outer surfaces of the lumiphor support element. In one embodiment, multiple emitter support elements are arranged under or within (e.g., an inner surface of) a single lumiphor support element. In another embodiment, a first emitter support element (supporting at least one first electrically activated emitter) is arranged under or within an inner surface of a first lumiphor support element, and a second emitter support element (supporting at least one second electrically activated emitter) is arranged beyond an outer surface of the first lumiphor support element, such that at least a portion of emissions from the at least one second electrically activated emitter may escape a lighting device without traversing the first lumiphor support element. In one embodiment, multiple lumiphor support elements may be arranged across different portions of or an entirety of a light transmissive portion of a lighting device.

A lumiphor support element may be integrated with or supplemented with at least one optical element, including but not limited to an optical filter and/or an optical reflector. In one embodiment, lighting device comprises a dichroic filter disposed between an electrically activated emitter and a lumiphor, and arranged to permit transmission of a first wavelength range but reflect wavelengths of another wavelength range, so as to permit emissions from an electrically activated emitter to be transmitted to a lumiphor, but to outwardly reflect converted emissions generated by the lumiphor, thus preventing lumiphor emissions from being transmitted to (and absorbed by) the electrically activated emitter.

In one embodiment, at least one lumiphor is spatially segregated from and arranged to receive emissions from multiple electrically activated emitters having different peak wavelengths, with the at least one lumiphor providing both wavelength conversion and light diffusion (e.g., mixing) utility.

A spatially segregated lumiphor may be arranged to fully cover or only partially cover one or more electrically activated emitters of a lighting device. In one embodiment, a lumiphor is arranged with a substantially constant thickness and/or concentration relative to different electrically activated emitters. In one embodiment, a lumiphor may be arranged with substantially different thickness and/or concentration relative to different emitters. In one embodiment, a lumiphor is arranged to cover all electrically activated emitters of a lighting device, but with substantially different thickness and/or concentration of lumiphor material proximate to different electrically activated emitters. For example, a lumiphor in the form of a yellow phosphor may be arranged with a greater thickness and/or lumiphor concentration proximate to one or more blue LEDs in order to convert a significant fraction of blue LED emissions to yellow phosphor emissions, but the yellow phosphor may have a reduced (but nonzero) thickness and/or concentration relative to one or more LEDs of different colors (e.g., red and green) to reduce phosphor absorption and increase the amount of light transmitted by the LEDs of different colors, while the presence of the yellow phosphor serves to at least partially diffuse or mix emissions from the different LEDs. The foregoing yellow phosphors may be supplemented by or replaced with phosphors of any desired color, such as red, orange, green, cyan, etc.; similarly, the foregoing electrically activated emitters may be supplemented by or replaced with electrically activated emitters of any desired color(s), including electrically activated emitters in combination with lumiphors.

A lumiphor that is spatially segregated from one or more electrically activated emitters may have associated light scattering particles or elements, which may be arranged with substantially constant thickness and/or concentration relative to electrically activated emitters of different colors, or may be intentionally arranged with substantially different thickness and/or concentration relative to different electrically activated emitters. Multiple lumiphors (e.g., lumiphors of different compositions) may be applied with different concentrations or thicknesses relative to different electrically activated emitters. In one embodiment, lumiphor composition, thickness and/or concentration may vary relative to multiple electrically activated emitters, while scattering material thickness and/or concentration may differently vary relative to the same multiple electrically activated emitters. In one embodiment, at least one lumiphor material and/or scattering material may be applied to an associated support surface by patterning, such may be aided by one or more masks.

In one embodiment, a lighting device is arranged to supply electric current independently to different individual electrically activated emitters, or to different groups of electrically activated emitters, thereof. A control circuit may be integrated into a lighting device or arranged external to the lighting device. Independent control of different emitters may allow for tuning during manufacture and/or during use, to permit adjustment of color, color temperature, luminous flux, and operating temperature. In one embodiment, a control circuit may be arranged to simultaneously control output of multiple lighting devices each including multiple electrically activated emitters.

In one embodiment, one or more sensors (e.g., optical sensor, thermal sensor, pressure sensor, differential pressure sensor, operating time sensor, and/or airflow sensor, etc.) may be arranged to sense a condition indicative of any change in light, temperature, pressure, etc., and control of one or more electrically activated emitters may be adjusted responsive to the output of the one or more sensors. One or more sensors may be arranged in or on a lighting device, or arranged separately from a lighting device but in at least intermittent electrical communication with a control circuit in electrical communication with the lighting device.

In certain embodiments, a lighting device includes emitting elements arranged to output at least three different color peaks, or at least four different color peaks, in the visible range. Such color peaks may be generated by various combinations electrically activated emitters and lumiphors, but preferably includes multiple different electrically activated emitters that are independently controlled to enable color, chromaticity, color temperature, luminous flux, and/or any other desired parameter, to be varied. In one embodiment, each color peak has a peak wavelength that differs from each other color peak by preferably at least about 25 nm, at least about 30 nm, at least about 40 nm, at least about 50 nm, or at least about 60 nm. In certain embodiments, a lighting device arranged to output multiple color peaks may include one or more of the following: a first peak wavelength in a range of from about 380 nm to about 499 nm, a second peak wavelength in a range of from about 596 nm to about 750 nm, and third peak wavelength in a range of from about 500 nm to about 559 nm, and a fourth peak wavelength in a range of from about 560 nm to about 595 nm.

In one embodiment, a lighting device may be arranged to a short wavelength blue peak (e.g., having a dominant wavelength in a range of from about 380 nm to about 470 nm); a long wavelength blue peak (e.g., having a dominant wavelength in a range of from about 471 to about 499 nm), a cyan and/or green peak (e.g., having a dominant wavelength in a range of from about 500 to about 559 nm), a yellow peak (e.g., having a dominant wavelength in a range of from about 560 nm to about 595 nm), and/or a red and/or orange peak (e.g., having a dominant wavelength in a range of from about 596 nm to about 750 nm). The foregoing peaks in the visible range may be provided by any suitable combinations of electrically activated emitters and/or lumiphors.

In one embodiment, first through third peak wavelengths of a lighting device are generated by different electrically activated emitters, and the fourth peak wavelength is generated by at least one lumiphor. In one embodiment, first through fourth peak wavelengths are output by different electrically activated emitters, with at least one first electrically activated emitter arranged to stimulate a first lumiphor, and with another electrically activated emitter having a different peak wavelength range to stimulate a second lumiphor. In one embodiment, a lighting device includes a first electrically activated emitter having a peak wavelength in a range of from about 380 nm to about 470 nm and arranged to stimulate emissions from a first lumiphor, a second electrically activated emitter having a peak wavelength in a range of from about 471 to about 499 nm and arranged to stimulate emissions from a second lumiphor that differs from the first, and at least one (preferably multiple) electrically activated emitters having different peak wavelengths such as from about 500 nm to about 559 nm, and from about 596 to about 750 nm. At least one lumiphor associated with the foregoing device may have a peak wavelength in a range of from about 560 nm to about 595 nm. Additional and/or different electrically activated emitters and/or lumiphors (e.g., with different peak wavelengths) may be provided.

In various embodiment, lighting devices as disclosed herein have a color rendering index in a range of from about 90 to about 99

In one embodiment, multiple electrically activated emitters of at least one identical or substantially identical peak wavelength are provided (e.g., in conjunction with other electrically activated emitters of different peak wavelengths); the foregoing multiple emitters may be separately controlled or controlled as a group.

In one embodiment, a lighting device includes at least one (e.g., GaN-based LED) electrically activated emitters having peak emissions in the blue wavelength range arranged on a first emitter support element, at least one lumiphor (e.g., yellow phosphor) spatially segregated from the preceding blue electrically activated emitters, at least one (e.g., AlInGaP-based LED) electrically activated emitter arranged on a second support element, wherein the first emitter support element and the second emitter support element are spatially segregated from and/or in insubstantial thermal communication with one another. One or more additional electrically activated emitters (e.g., green, cyan, and/or white (in the form of a blue electrically activated emitter with yellow lumiphor)) may also be provided, supported by the first emitter support element or by a third emitter support element that is spatially segregated from and/or in insubstantial thermal communication with the second emitter support element. Each different electrically activated emitter or group of electrically activated emitters of different peak wavelengths may be independent controlled. At least one lumiphor may be arranged to receive emissions from one or more (optionally all) of the electrically activated emitters.

In one embodiment, a lighting device includes a remote lumiphor, at least one first electrically activated emitter supported by a first emitter support element, at least one second electrically activated emitters supported by a second emitter support element that is spatially segregated and/or in insubstantial conductive thermal communication with the first emitter support element, wherein at least a portion of the second emitter support element is arranged to permit transmission of emissions from the at least one first electrically activated emitter. Electrical traces or conductors may extend on, over, or within an emitter support element, including an emitter support element comprising an optically transmissive material. The second emitter support element may optionally include an optical filter and/or an optical reflector, such as may be embodied in a dichroic filter. In one embodiment, a second emitter support element may be arranged between a first emitter support element and a first lumiphor, wherein at least a portion of the second emitter support element is substantially transmissive of a first peak wavelength generated by a first electrically activated emitter supported by the first emitter support element. In another embodiment, a first lumiphor may be arranged between a first electrically activated emitter having a first peak wavelength and a second electrically activated emitter having a second peak wavelength.

In one embodiment, a lighting device arranged to emit three, four, or five or more color peaks includes a diffuser arranged to receive at least a portion of emissions from at least two, at least three, at least four, at least five, or all emitters arranged to generate such peaks, whether such emitters constitute electrically activated emitters or lumiphors.

In one embodiment, at least one of a first emitter support element and a second emitter support element is associated with or comprises a reflector arranged to receive light from one or more (preferably all) electrically activated emitters and at least one lumiphor. Such a reflector may have a base and at least one angled wall that may form a cup-like shape. Electrically activated emitters may be mounted on or over a base portion and/or an angled wall portion of a reflector. In one embodiment, an emitter support element may be highly reflective in character prior to mounting of an electrically activated emitter thereon. In another embodiment, an emitter support element may be rendered reflective (such as by application of a reflective material) after the mounting of an electrically activated emitter thereon. In one embodiment, a reflector element may include one or more windows and may be fitted over an emitter support element to permit at least a portion of one or more electrically activated emitters to extend into or through one or more windows defined in the reflector element. In certain embodiments, a reflector surface may include a highly reflective (e.g., 98-99% reflective) diffuse white material.

In one embodiment, multiple emitter support elements initially arranged in a planar configuration may be subjected to one or more processing or fabrication steps, and one or more of the emitter support elements may be subsequently bent or otherwise shaped into a non-planar configuration. Processing steps may include, but are not limited to, one or more of the following: addition of insulating materials, connecting of emitter support element with insulating materials, formation of electrical traces, formation of wirebonds, formation of electrical contacts, mounting of emitters, connection of heatsinks, deposition or application of reflective materials, addition of encapsulants, and the like. In one embodiment, one or more emitter support element may be shaped to form at least one wall of a reflector arranged to reflect light from at least one electrically activated emitter (more preferably all emitters) of a lighting device including the multiple emitter support elements.

In certain embodiments, lighting devices including multiple emitter support elements as disclosed herein may be configured as light bulbs. A light bulb may include an interior support structure (e.g., configurable as one or more support columns) extending upward from a base thereof (which may have associated electrical contacts for mating with an electrical receptacle to receive electric current) to support electrically activated emitters such as LEDs. The term "support column" as used herein is intended in a functional sense to refer to an element extending in a direction between a base end and an electrically activated emitter of a light bulb (e.g., LED light bulb), and providing direct or indirect support for one or more emitters. Direct support in this context contemplates mounting of an electrically activated emitter to a surface formed on or over a support column, whereas indirect support contemplates presence of one or more structural elements arranged between a support column and the electrically activated emitter. A support column is not strictly limited to any particular shape or conformation. A support column may provide structural, electrical, and/or heat transfer functions. A single support column may comprise a single or multiple emitter support element, and multiple support columns (each including or constituting one or more emitter support elements) may be provided.

In one embodiment, at least one LED drive circuit element and/or LED control circuit element is arranged in or on a support column of a light bulb including at least one LED. Such circuits may include, but are not limited to driver circuits, ballast circuits, dimmer circuits, voltage control circuits, current control circuits, color control circuits, electrostatic discharge elements, sensors and/or sensory feedback circuits, temperature protection circuits, and the like. Thermally insulating materials may be provided between support columns or portions thereof. Multiple support columns supporting different electrically activated emitters may be provided in any desired configuration.

In one embodiment, a light bulb includes a lighting device as described herein (e.g., including electrically activated emitters supported on different emitter support elements), multiple electrical conductors in electrical communication with multiple electrically activated emitters, and first and second electrical contacts arranged to mate with an electrical receptacle to receive electric current, wherein the first and second electrical contacts are in electrical communication with multiple electrical conductors.

In one embodiment, a lighting device (such as may be embodied in a light bulb) may include one emitter support element that forms a substantially tubular shape (e.g., of any suitable cross-sectional shape, whether round, square, polygonal, etc.) and another emitter support element that extends through an interior of a tubular shape. In one embodiment, multiple emitter support elements may constitute a support column. A thermally insulating material (e.g., which may be annular in shape) may be arranged between the preceding emitter support elements. In one embodiment, a lighting device (such as may be embodied in a light bulb) may include an interior support structure including multiple emitter support elements that are stacked over one another, with intervening gaps and/or thermally insulating materials arranged between different emitter support elements. Electrical connections to electrically activated emitters supported by the different emitter support elements may be made by conductive elements (e.g., wires, traces, etc., optionally covered with electrically insulating material) extending on and/or within emitter support elements and any intervening thermally insulating materials. One or more heatsinks may be arranged in conductive thermal communication with electrically activated emitters by way of at least one of the first emitter support element and the second emitter support element.

In one embodiment, a lighting device embodied in a light bulb includes at least one lumiphor that spatially segregated from at least one electrically activated emitter and structurally supported by a support structure interior to the light bulb. In one embodiment, at least one lumiphor is supported by a support column interior to a light bulb. One or more thermally insulating materials may be provided between a lumiphor and an associated structural support. A light bulb may include a cover comprising a diffuser arranged to diffuse light emitted by one or more emitters. A cover associated with a lighting device as described herein may be provided in any suitable size or shape, including planar, spherical, hemispherical, and the like. In one embodiment, a light bulb includes at least one lumiphor that is coated on or otherwise supported by an at least partially transmissive cover or 'globe' of the light bulb. Transmissive materials in this context refer to materials adapted to transmit at least a portion of light in the visible spectrum, and may include polymeric materials and/or glass.

A cover for a light bulb include one or more lenses to provide focusing, directional pointing, or light shaping utility. One or more lumiphors associated with or supported by a light bulb cover may serve as a diffuser, may be supplemented with one or more light scattering elements (e.g., optionally arranged as light scattering particles that may be dispersed with a lumiphor material in a common binding material), or may be arranged in series with at least one light diffusing, light scattering, or light mixing element. In one embodiment, at least one lumiphor and/or diffuser element is intermediately supported between one or more electrically activated emitters and at least one light scattering or light diffusing element. Multiple lumiphors may be provided, with one or more lumiphors arranged to receive light emissions from portions or the entirety of one, multiple, or all electrically activated emitters of a lighting device. Different lumiphors may be arranged in different thicknesses and/or concentrations relative to different electrically activated emitters. The presence or absence of different lumiphors may vary in relation to different electrically activated emitters within a single lighting device.

In one embodiment, a light fixture includes at least one lighting device as disclosed herein. In one embodiment, a light fixture includes first and second lighting devices each including at least one first, at least one second, and at least one third electrically activated emitter as disclosed herein, and the light fixture includes a control circuit arranged to independently control supply of current to (a) the at least one first electrically activated emitter, (b) the at least one second electrically activated emitter, and (c) the at least one third electrically activated emitter, of the first lighting device and the second lighting device.

Various aspects of the present invention will be described more fully hereinafter with reference to the accompanying drawings, in which embodiments of the invention are shown. The present invention may, however, be embodied in many different forms and should not be construed as limited to the specific embodiments set forth herein. Rather, these embodiments are provided to convey illustrative aspects of the invention to those skilled in the art. In the drawings, the size and relative sizes of layers and regions may be exaggerated for clarity.

FIG. 1 illustrates a lighting device 100 including a lumiphor support element 130 having an associated lumiphor that is spatially segregated from a first group of electrically activated emitters (e.g., LEDs) 121A-121C arranged on a first emitter support element 111. The lumiphor support element 130 may include a filter 138 (e.g., a dichroic filter) along or proximate to an inner surface thereof. A second emitter support element 112 supporting at least one second electrically activated emitter 122, and a third emitter support element 113 supporting at least one third electrically activated emitter 123, are separated from the first support element 111 by intervening thermal insulators 118, 119, respectively. Each of the first emitter support element 122 and the second emitter support element 123 is angled (e.g., in a substantially conical shape) relative to the first emitter support element 111 to serve as reflectors or supports for reflective materials. One or more reflective materials may be deposited or otherwise arranged over the second and third emitter support element 112, 113, to direct light toward one or more lumiphors arranged in or on the lumiphor support element 130. A secondary reflector 107 may be arranged between the lumiphor support elements 130 and an emissive end 109 of the lighting device 100. Each electrically activated emitter 121A-121C, 122, 123 is spatially segregated from the lumiphor support element 130 and associated lumiphor, with a gap 101 extending therebetween. The gap 101 may be open, or may be at least partially filled with an optically transmissive material such as an encapsulant. One or more of the emitters support elements 111-113 may comprise a MCPCB or other substrate, optionally in conductive thermal communication with at least one heatsink (not shown). Any one or more electrically activated emitters 121A-121C, 122, 123 may be mounted directly to its associated emitter support element 111-113, or indirectly mounted via at least one submount or other intervening structure (not shown). At least two, more preferably at least three, and more preferably at least four of the electrically activated emitters 121A-121C, 122, 123 are adapted to generate emissions of different peak wavelengths in the visible range, and at least one lumiphor is arranged to generate emissions with another peak wavelength; preferably, at least a portion of the emissions of each peak wavelength is transmitted through the emissive end 109 of the lighting device 100. Multiple lumiphors having different peak wavelengths may be provided, and may be stimulated by emissions from different electrically activated emitters 121A-121C, 122, 123. In one embodiment, each electrically activated emitter 121A-121C, 122, 123 comprises a LED.

In operation of the lighting device 100, current may be separately controlled to any or all of the electrically activated emitters 121A-121C, 122, 123 via a control circuit (not shown). Emissions from one or more of the electrically activated emitters 121A-121C, 122, 123 are received by at least one lumiphor associated with the lumiphor support element 130. Preferably, only a portion of the emissions from one or more of the electrically activated emitters 121A-121C, 122, 123 is absorbed by the at least one lumiphor, and the remainder of the emissions emanating from the electrically activated emitters 121A-121C, 122, 123 are transmitted through the lumiphor support element 130 and associated lumiphor(s) in a direction toward the emissive end 109 of the lighting device 100. By varying supply of current to one or more of the electrically activated emitters 121A-121C, 122, 123, various parameters such as color, color temperature, chromaticity, and luminous flux may be controlled. Since at least one lumiphor associated with the lumiphor support element 130 is spatially segregated from the electrically activated emitters 121A-121C, 122, 123, heating of the lumiphor may be reduced. Since the various emitter support elements 111-113 are separated by thermally insulating materials, conductive thermal syndication between such elements 111-113 (and the electrically activated emitters 121A-121C, 122, 123 associated with different support elements 111-113) is likewise reduced, preferably resulting in insubstantial conductive thermal communication therebetween.

Surface features (not shown) may be arranged along an outer surface of the lumiphor support element 310 to promote uniform illumination of the outer surface 312 via the electrically activated emitters 323, 320 and/or lumiphor associated with the lumiphor support element 310. The lumiphor support element 130 may comprise or have associated therewith one or more optical scattering or diffusing elements, such as scattering particles or films.

In one embodiment, at least one emitter of the first group of electrically activated emitters 121A-121C comprises a III-nitride based blue LED, at least one of the second or third electrically activated emitters 122, 123 comprises a III-phosphide based red or orange LED, and at least one lumiphor associated with the lumiphor support element 130 include a yellow or yellow-green phosphor. In one embodiment, a third electrically activated emitter 123 comprises a green LED. In one embodiment, at least one electrically activated emitter (e.g., of emitters 121A-121C) comprises a blue LED combined with a yellow phosphor. In one embodiment, at least one electrically activated emitter (e.g., of emitters 121A-121C) comprises a cyan LED and/or a blue LED with a cyan phosphor. Electrically activated emitters and/or lumiphors of additional or different colors may be provided.

Figure 2B:
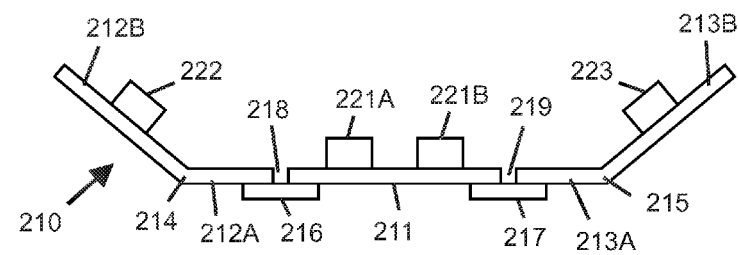
FIG. 2B is a schematic side cross-sectional view of the subassembly of the lighting device of FIG. 2A in a second state of manufacture, following shaping of the second and third emitter support elements.
Figure 2C:
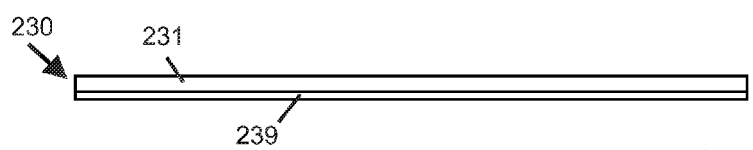
FIG. 2C is a schematic side cross-sectional view of a lumiphor-containing portion of a lighting device for use with the subassembly of FIG. 2B.
Figure 2D:
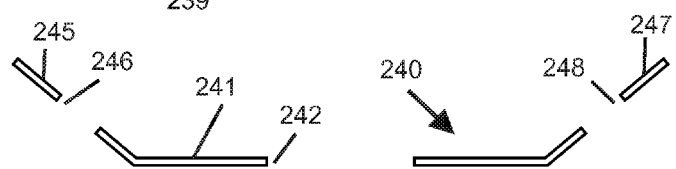
FIG. 2D is a schematic side cross-sectional view of a reflector insert portion of a lighting device for use with the subassembly of FIG. 2B.
Figure 2E:
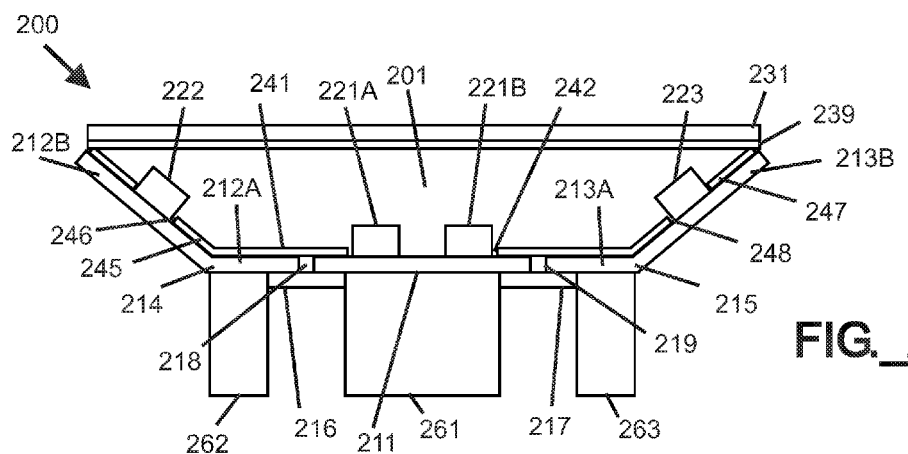
FIG. 2E is a schematic side cross-sectional view of at least a portion of a lighting device including the subassembly of FIG. 2B, the lumiphor-containing portion of FIG. 2C, and the reflector insert portion of FIG. 2D, and heatsinks in thermal communication with the emitter support elements.

FIG. 2E illustrates a lighting device 200 including multiple emitter support elements 211-213 supporting different electrically activated emitters 221A-221B, 222, 223, with FIG. 2A-2D illustrating portions of the lighting device 200 during various state of manufacture.

FIGS. 2A-2B show a subassembly 210 including the emitter multiple support elements 211-213 (which may comprise MCPCBs) having gaps 218, 219 (optionally containing thermally insulating materials) therebetween, with a first thermally insulating connecting element 216 connecting the first and second emitter support elements 211, 212, and with a second thermally insulating connecting element 217 connecting the first and third emitter support elements 211, 213. A first group of electrically activated emitters 221A-221B is mounted on or over the first emitter support element 211, at least one second electric activated emitter 222 is mounted on or over the second emitter support element 212, and at least one third electrically activated emitter 223 is mounted on or over the third emitter support element 213. In FIG. 2A, the emitter support elements 211-213 are arranged in a substantially planar figuration. Any of various bending and/or shaping operations may be applied to the subassembly 210 to create bends 214, 215 in the second and third emitter support elements 212, 213, respectively. Following such bending and/or shaping operations, one angled portion 212A, 213A of each of the second emitter support element 212 and the third emitter support element 213, respectively, is arranged non-coplanar with the first emitter support element 211, with another portion 212B, 213B of each of the second emitter support element 212 and the third emitter support element 213, respectively, being unchanged. The angled portions 212A, 213A may be used as reflectors or to support reflective elements. Since various subassembly processing and/or fabrication steps (e.g., patterning, deposition, element placement, soldering, etc.) are more easily completed in a substantially planar configuration, it is advantageous to shape the subassembly to form the angled portions 212A, 213A after performance of such processing and/or fabrication steps.

FIG. 2C illustrates a lumiphor support element 230 including multiple functional portions 231, 239. In one embodiment, the portions 231, 239 comprise different lumiphors. In one embodiment, one portion 239 comprises an optical element such as a dichroic filter, and another portion 231 comprises at least one lumiphor. In one embodiment, one portion 231 comprises at least one lumiphor, and another portion comprises at least one light diffusing and/or light scattering element. One portion 231 may include surface features (e.g., protrusion, recesses, roughened regions, etc.) to promote uniform illumination. In one embodiment, two or more of the foregoing configurations referenced in connection with FIG. 2C are combined. The lumiphor support element 230 may be prefabricated and applied over an open end of the subassembly 210 of FIG. 2B.

FIG. 2D illustrates a reflector insert element 240 including a first base portion 241 defining a first window, a second angled portion 245 defining a second window 246, and a third angled portion 247 defining a third window 248. At least one (e.g., upper) surface of the reflector element 240 is preferably highly reflective (e.g., 98-99%), fabrication and/or coating with a diffuse white reflector and/or silvering. At least a portion (e.g., core portion) of the reflector insert element 240 may comprise metal, polymeric and/or ceramic materials, and the element 240 may be fabricated by any appropriate process such as molding, machining, sintering, and the like. In one embodiment, at least a lower surface (i.e., not exposed to light) of the reflector insert element 240 comprises a thermally insulating material to reduce conductive thermal communication between different emitter support elements 211-213 that may be contacted by the reflector insert element 240. The reflector insert element 240 may be fitted over the subassembly 210 of FIG. 2B with at least a portion of each electrically activated emitter 221A-221B, 222, 223 extending into and/or through the respective windows 242, 246, 248.

FIG. 2E illustrates the lighting device 200 including the subassembly 210 of FIG. 2B, the lumiphor support element 230 illustrated in FIG. 2C, and the reflector insert portion 240 of FIG. 2D. The reflector insert portion 240 is fitted into the open end of the subassembly 210 with each window 242, 246, 248 fitting over at least one electrically activated emitter 221A-221B, 222, 223. The lumiphor support element 230 is affixed over an open end of the subassembly 210 with the lumiphor support element 230 being spatially segregated from each electrically activated emitter 221A-221B, 222, 223. A first heatsink 261 may abut (or otherwise be in conductive thermal communication with) the first emitter support element 211, and second and third heatsink elements 262, 263 may abut (or otherwise be in conductive thermal communication with) the second and third emitter support elements 212, 213 (or portions thereof 212A, 213A), respectively. In one embodiment, the second and third heatsink are integrated into a single heatsink having an annular shape, in conductive thermal communication with the second and the third emitter support elements 212, 213 (which may optionally be integrated into a single (e.g., annular-shaped) emitter support element). Configuration and operation of the device 200 illustrated in FIG. 2E may be substantially similar to operation of the preceding device 100 illustrated in FIG. 1.

FIG. 3 illustrates a lighting device 300 similar in multiple respects to the device 200 illustrated in FIG. 2E, but including numerous lumiphor support and/or light diffusing elements. The lighting device 300 includes multiple emitter support elements 311-313 (which may comprise MCPCBs) supporting different electrically activated emitters 321A-321B, 322, 323, with gaps 318, 319 (optionally containing thermally insulating materials) between respective emitter support elements 311-313. Thermally insulating connecting elements 316, 316 may be arranged to connect the emitter support elements 311-313 without permitting substantial conductive thermal communication therebetween. The second and third electrically activated emitters 322, 323 are arranged on angled portions of the second and third emitter support elements 312, 313. A first heatsink 361 may abut (or otherwise be in conductive thermal communication with) the first emitter support element 311, and second and third heatsink elements 362, 363 may abut (or otherwise be in conductive thermal communication with) the second and third emitter support elements 312, 313 (or portions thereof 312A, 313A), respectively. A reflector insert element 340 including a base portion 341 and angled wall portions 342, 343 defining windows 342, 346, 348 may be fitted over the emitter support elements 311-312 with at least a portion of each electrically activated emitter 321A-321B, 322, 323 extending into and/or through the respective windows 342, 346, 348.

A first lumiphor support and/or light diffusing element 331 is arranged, and spatially segregated via a first gap 301, over the first group of electrically activated emitters 321A, 321B. A second lumiphor support and/or light diffusing element 332 is arranged, and spatially segregated via a second gap 302, over the at least one second electrically activated emitter 322. A third lumiphor support and/or light diffusing element 333 is arranged, and spatially segregated via a third gap 303, over the at least one third electrically activated emitter 323. Another gap 304 is provided between the foregoing lumiphor support elements 331-333 and a common lumiphor support and/or light diffusing element 330. One or more of the foregoing gaps 301-304 may be at least partially filled (e.g., with optically transmissive encapsulant or other material), but complete filling of such gaps 301-304 may be avoided unless thermally insulating filling materials are used, to reduce conductive heating of lumiphors by electrically activated emitters 321A-321B, 322, 323. In various embodiments, one or more of the foregoing lumiphor support and/or light diffusing elements 330-333 may be partially or completely eliminated. Current may be independently controlled to each electrically activated emitter 321A-321B, 322, 323, and such emitters may be arranged in combination to output numerous different peak wavelengths. One or more of the lumiphor support and/or light diffusing elements 331-333 may include lumiphors (e.g., phosphors) arranged to receive at least a portion of emissions from an underlying electrically activated emitter and responsively convert absorbed emissions to emissions having a different peak wavelength. In one embodiment, at least two of the lumiphor support and/or light diffusing elements 331-333 comprise lumiphors, and the common lumiphor support and/or light diffusing element 330 comprises a light diffusing element. In one embodiment, at least one of the lumiphor support and/or light diffusing elements 331-333 comprises multiple lumiphors of different peak wavelengths. Any of various permutations of lumiphors and/or light diffusing elements may be employed among the elements 330-333.

In one embodiment, a first emitter support element supporting at least one first electrically activated emitter is arranged under or within an inner surface of a first lumiphor support element, and a second emitter support element supporting at least one second electrically activated emitter is arranged beyond an outer surface of the first lumiphor support element, such that emissions from the first electrically activated emitter must traverse the first lumiphor support element to escape the lighting device, but emissions from the second electrically activated emitter may escape the lighting device without traversing the lumiphor support element. For example, referring to FIG. 4, a lighting device 400 includes a first emitter support element 411 supporting first electrically activated emitters 421A-421C, at least a second emitter support element 412 supporting additional electrically activated emitters 422, 423, and a lumiphor support element 430 arranged over the first electrically activated emitters 421A-421C but not arranged over the additional electrically activated emitters 422, 423. Each lumiphor support element 411, 412 may comprise a PCB such as a MCPCB. The first electrically activated emitters 421A-421C are spatially separated from the lumiphor support element 430 by a gap 401, which may be partially filled with material such as an optically transmissive encapsulant. A first reflector 444 (e.g., arranged as a reflector cup with angled and/or curved walls providing light reflecting utility) is arranged proximate to the first emitters 421-421C to reflect light toward the lumiphor support element 431. The lumiphor support element may include a lumiphor portion 431 including lumiphor coated and/or dispersed therein (optionally including one or more light diffusing and/or scattering elements) and an optical element portion 439 (for example, a dichroic filter) arranged to permit transmission of selected wavelengths (e.g., in a direction toward the lumiphor 431) but reflect other wavelengths (e.g., to prevent lumiphor emissions from being transmitted toward the first emitters 421A-421C). At least a second emitter support element 412 serving as (or associated with) a second reflector extends above the lumiphor support element 430, and is arranged to support electrically activated emitters 422, 423 each having an associated submount or bond pad 422A, 423A. The second reflector is arranged to reflect light toward the emissive end 409 of the lighting device 400. Electrical traces may be formed on one or more surfaces of the second lumiphor support element 412.

Thermally insulating elements 418, 419 are provided between the first reflector 444, the lumiphor support element 430, and the second emitter support element 412 to reduce conductive thermal communication therebetween, preferably to an insubstantial level. In one embodiment, the second emitter support element 430 comprises a single element. In another embodiment, the second emitter support element comprises multiple portions that are spatially segregated and/or thermally insulated from one another (e.g., utilizing thermally insulating materials (not shown)), such that the emitters 422, 423 may be in insubstantial conductive thermal communication with one another. A cover 450 that is at least partially transmissive of emissions generated by the electrically activated emitters 421A-421C, 422, 423 and the lumiphor(s) 431 is arranged at an emissive end 409 of the lighting device 400. Such cover 450 may serve to focus, direct, scatter, mix, or otherwise affect light emitted from the one or more emitters 420-422, 423B, and 424B, as well as protect components internal to the lighting device 400. In one embodiment, the cover 450 may comprise at least one lumiphor arranged to convert a wavelength of emissions generated by one or more electrically activated emitters 421A-421C, 422, 423.

In one embodiment, distribution of emissions of the electrically activated emitters 421A-421C, 422, 423 and at least one lumiphor 431 is roughly Lambertian, such that light may not be mixed in the near field, but may be sufficiently mixed in the far field, with a substantial portion of light in the aggregated beam being reflected by one or both reflectors 444, 412. If far field mixing is adequate, then various diffusing, scattering, or other color mixing elements or functions associated with the cover 450 may be omitted, and/or the cover 450 may be omitted entirely. Although the cover 450 is shown as extending across substantially all of a light-emitting portion of the light-emitting end 409, in one embodiment, the cover 450 may extend over only a portion thereof. The cover 450 may be uniform or non-uniform (e.g., respecting thickness, lumiphor thickness and/or concentration, diffusing/scattering element thickness and/or concentration, and the like) with respect to position. In various embodiments, the lighting device 400 may embody any type of lighting device, including, but not limited to, a reflector-type light bulb.

In various embodiments, any combination of LEDs of various colors and/or configurations (e.g., blue, green, white (blue LED plus yellow phosphor), cyan, red, etc.) may be arranged on the first emitter support element 411, and any combination of additional LEDs of further colors and/or configurations (e.g., red, green, cyan, orange, blue, white) may be arranged on the second emitter support element 412. In one embodiment, one emitter support element 411, 412 has III-nitride-based emitters supported thereon, and the other emitter support element 411, 412 has III-phosphide-based emitters supported thereon. Aggregated emissions from the lighting device 400 may include numerous (e.g., three, four, five, or more) wavelength peaks, including emissions from the electrically activated emitters 421A-421C, 422, 423 and at least one lumiphor associated with the lumiphor support element 430.

In certain embodiments, a first emitter support element may be arranged to support at least one first electrically activated emitter thereon or thereover, with a second emitter support element having at least one optically transmissive portion arranged over the first emitter support element and supporting at least one second electrically activated emitter, and with a spatially segregated lumiphor support element arranged over all of the foregoing electrically activated emitters. Light diffusing and/or mixing utility may be provided by the lumiphor support element and/or an additional diffuser, to diffuse and/or mix light emitted by the electrically activated emitters.

FIG. 5 illustrates a lighting device 500 including first electrically activated emitters 521A-521C supported by a first lumiphor support element 511 and additional electrically activated emitters 522, 523 supported by a second lumiphor support element 512 arranged over the first lumiphor support element 511. At least a portion of the second lumiphor support element comprises a material (e.g., polymeric and/or glass material) that is substantially optically transmissive of light emitted by the first electrically activated emitters 521A-521C. Electrical traces may be formed on either or both faces of the first and/or second emitter support elements 511, 512. A lumiphor support element 530 is spatially segregated from and arranged over the first and the second lumiphor support elements 511, 512. The lumiphor support element 530 may optionally provide light diffusing, scattering, mixing, focusing, shaping, and/or filtering utilities. Surface features (not shown) may be arranged along an outer surface of the lumiphor support element 530 to promote even light distribution. In one embodiment, the lumiphor support element 530 comprises one or more lumiphors arranged over a dichroic filter, with a diffusing element (e.g., in the form of light scattering particles and/or surface features arranged to diffuse or scatter light) arranged over the dichroic filter and at least a portion of the lumiphor(s). The lumiphor support element 530 therefore may receives emissions from all of the electrically activated emitters 521A-521C, 522, 523 for wavelength conversion utility and also mixing, diffusion, scattering, or focusing utility.

A first reflector 544 (e.g., arranged as a reflector cup with angled and/or curved walls providing light reflecting utility) is disposed around the lateral extent of the first and second emitter support elements 511, 512 and is arranged to reflect emissions of the emitters 521A-521C, 522, 523 in a direction toward the lumiphor support element 530. The second emitter support element 512 spans across at least a portion of the cup-like shape formed by the first reflector 544, with a gap 501A between the first and second emitter support elements 511, 512. Thermally insulating elements 418, 419 are provided between the first lumiphor support element 511 and the second lumiphor support element 512 to limit conductive thermal communication therebetween. Although the thermally insulating elements 518, 519 are illustrates as being positioned between the first emitter support element 511 and the first reflector 544, thermally insulating elements (not shown) may be alternatively or additionally be provided between the first reflector 544 and the second emitter support element 512. A second reflector 554 extends above the lumiphor support element 530, and is arranged to reflect light toward the emissive end 509 of the lighting device 500. One or more additional elements (e.g., providing light scattering, diffusing, mixing, shaping, and/or directing utility) (not shown) may optionally span at least a portion of the opening created by the second reflector between the lumiphor support element 530 and the light emitting end 509 of the lighting device 500.

Aggregated emissions from the lighting device 500 may include numerous (e.g., three, four, five, or more) wavelength peaks, including emissions from the electrically activated emitters 521A-521C, 522, 523 and at least one lumiphor associated with the lumiphor support element 530. Preferably, at least one lumiphor associated with the lumiphor support element 530 absorbs only a portion of emissions of the electrically activated emitters 521A-521C, 522, 523 and permits passage of a remainder of such emissions.

In one embodiment, the second emitter support element 512 may be formed of a thermally conductive and optically transmissive material (e.g., having a thermal conductivity of at least 25 W/(m·° K) at about 25° C. and a transmittance of at least about 80% (e.g., sintered silicon carbide, crystalline silicon carbide, and high thermal conductivity glass such as may include indium tin oxide), to permit the second emitter support element 512 to conduct heat from the electrically activated emitters 522, 523 and also transmit light emitted by the first electrically activated emitters 521A-521C.

In various embodiments, any combination of LEDs of various colors and/or configurations (e.g., blue, green, white (blue LED plus yellow phosphor), cyan, red, etc.) may be arranged on the first emitter support element 511, and any combination of additional LEDs of further colors and/or configurations (e.g., red, green, cyan, orange, blue, white) may be arranged on the second emitter support element 512. In one embodiment, one emitter support element 511, 512 has III-nitride-based emitters supported thereon, and the other emitter support element 511, 512 has III-phosphide-based emitters supported thereon.

FIG. 6 illustrates a light bulb 600 according to one embodiment of the present invention including a support column 609 arranged within an interior 602 of a cover 650. The support column 609 includes a first emitter support element 611 supporting electrically activated emitters 621A-621D along an exterior (e.g., side) surface of the support column 609, with at least a portion of a second emitter support element 612 arranged within an interior of the first emitter support element 611, and a thermally insulating material 618 arranged between the first and second emitter support elements 611, 612. The second emitter support element 612 supports at least one additional electrically activated emitter 622 along an exterior (e.g., top) surface thereof. The first emitter support element 611 forms a substantially tubular shape (e.g., of any suitable cross-sectional shape, whether round, square, polygonal, etc.), that may comprise a closed annulus. The thermally insulating material 618 may similarly form a tubular (e.g., annular) shape between the first and second emitter support elements 611, 612. Conductive thermal communication between the first and second emitter support elements 611, 612 is limited due to spatial separation and/or the thermally insulating material 618. A lumiphor support element 630 is spatially segregated from but arranged over some emitters 621A-621B of the first emitters 621A-621D, and is separated from the emitters 621A-621B via a gap 601 (which optionally may be partially filled). At least one lumiphor may be associated with the lumiphor support element 630 by dispersion, coating, or other suitable methods. The cover 650 may serve to focus, direct, scatter, mix, or otherwise affect light emitted from the electrically activated emitters 621A-621D, 622 and the lumiphor support element 630, as well as protect components internal to the light bulb 600. In one embodiment, at least a portion of the cover comprises at least one additional lumiphor arranged to receive emissions from one or more of the electrically activated emitters 621A-621D and convert a portion of such emissions to at least one different peak wavelength.

The light bulb 600 includes a (threaded) lateral electrical contact 692 and a foot electrical contact 691 arranged along one end thereof. (Although the light bulb 600 is illustrated as having a screw-type Edison base, it is to be appreciated that lighting devices and light bulbs as disclosed herein may embodying any suitable type(s) of electrical contacts known in the art.)

Aggregated emissions from the lighting device 600 may include numerous (e.g., three, four, five, or more) wavelength peaks, including emissions from the electrically activated emitters 621A-621D, 622 and at least one lumiphor associated with the lumiphor support element 630 and (optionally) at least one lumiphor associated with the cover 650. Each electrically activated emitter 621A-621D, 622 may be independently controlled. One or more control circuit elements (not shown) may be arranged within the support column 609. In various embodiments, any combination of LEDs of various colors and/or configurations (e.g., blue, green, white (blue LED plus yellow phosphor), cyan, red, etc.) may be arranged on the first emitter support element 611, and any combination of additional LEDs of further colors and/or configurations (e.g., red, green, cyan, orange, blue, white) may be arranged on the second emitter support element 612. In one embodiment, one emitter support element 511, 512 has III-nitride-based emitters supported thereon, and the other emitter support element 511, 512 has III-phosphide-based emitters supported thereon (e.g., with the second emitter support element 612 comprising a red LED 622, and with the first emitter support element 611 comprising blue, green, and/or white (blue LED combined with yellow phosphor) LEDs). It is to be appreciated that additional and/or different colors may be utilized for any of the foregoing.

FIG. 7 illustrates a light bulb 700 that is substantially similar in character to the light bulb 600 illustrated in connection with FIG. 6, except that the lumiphor support element 730 extends over all of the electrically activated emitters 721A-721D, 722, so that emissions from each emitter 721A-721D, 722 are received by the lumiphor support element 730. A column 709 is arranged within the interior 702 of the bulb 700. Preferably, at least a portion of the emissions generated by each electrically activated emitter 721A-721D, 722 is transmitted through the lumiphor support element 750. The support column 709 includes a first emitter support element 711 supporting electrically activated emitters 721A-721D, with at least a portion of a second emitter support element 712 arranged within an interior of the first emitter support element 711, and a thermally insulating material 718 arranged therebetween. At least one additional electrically activated emitter 722 is supported along an exterior (e.g., top) surface of the second emitter support element 712. Each of the first emitter support element 711 and the thermally insulating material 718 may form a substantially tubular shape. The lumiphor support element 730 is spatially segregated from but arranged over the electrically activated emitters 721A-721D, 722 via a gap 701 (of which a portion may be filled). At least one lumiphor may be associated with the lumiphor support element 730 by dispersion, coating, or other suitable methods. The cover 750 may serve to focus, direct, scatter, mix, or otherwise affect light emitted from the electrically activated emitters 721A-721D, 722, and may optionally include at least one additional lumiphor. In one embodiment, the lumiphor support element 730 between the electrically activated emitters 721A-721D, 722 and the cover 750 is eliminated, with the cover 750 serving as a sole lumiphor support element having at least one associated lumiphor arranged to receive emissions from the electrically activated emitters 721A-721D, 722 and convert a portion of such emissions to at least one different peak wavelength. Electrical contacts 791, 792 are provided along one end of the light bulb 700. The electrically activated emitters 721A-721D, 722 may be independently controlled by circuit elements (not shown) arrangeable within or beyond the light bulb 700. Aggregated emissions from the lighting device 700 may include numerous (e.g., three, four, five, or more) wavelength peaks, including emissions from the electrically activated emitters 721A-721D, 722 and at least one lumiphor associated with the lumiphor support element 730 and/or the cover 750.

FIG. 8 illustrates a light bulb 800 with a support column 809 including a first emitter support element 811 composed of first electrically activated emitters 821A-821D along an outer (e.g., side) surface thereof, with a second emitter support element 812 stacked thereon and supporting another electrically activated emitter 822 along an external (e.g., top) surface thereof. The light bulb 800 includes a lateral electrical contact 892 and a foot electrical contact 891 arranged along one end thereof, although other types of contacts may be substituted. A heatsink (not shown) may optionally be arranged around a lower portion of the bulb 800 proximate to the lateral contact 892. At least a portion of the second emitter support element 812 may be formed of a thermally insulating material, optionally including a thermally conductive core (not shown) extending therefrom for heat dissipation to a heatsink element (not shown). Electrical connections to the emitters 821A-821D, 822 may made via electrical traces (not shown) along external surfaces of the emitter support elements 811, 812 and/or electrical conductors arranged within the emitter support elements 811, 812. Conductive thermal communication between the first emitters 821A-821D and the second emitter 822 is limited due to the thermally insulating character of the second emitter support element 812. The second emitter 822 may have an associated submount or bond pad (not shown) arranged over the second emitter support element 812. A lumiphor support element 830 is spatially segregated from but arranged over some emitters 821A-821B of the first emitters 821A-821D, and is separated from the emitters 821A-821B via a gap 801 (which optionally may be partially filled). At least one lumiphor may be associated with the lumiphor support element 830 by dispersion, coating, or other suitable methods. The cover 850 may serve to focus, direct, scatter, mix, or otherwise affect light emitted from the electrically activated emitters 821A-821D, 822 and from the lumiphor support element 830, as well as protect components internal to the light bulb 800. In one embodiment, at least a portion of the cover 850 comprises at least one additional lumiphor arranged to receive emissions from one or more of the electrically activated emitters 821A-821D and convert a portion of such emissions to at least one different peak wavelength.

Aggregated emissions from the lighting device 800 may include numerous (e.g., three, four, five, or more) wavelength peaks, including emissions from the electrically activated emitters 821A-821D, 822 and at least one lumiphor associated with the lumiphor support element 830 and (optionally) at least one lumiphor associated with the cover 850. Each electrically activated emitter 821A-821D, 822 may be independently controlled via one or more control circuit elements (not shown) that may be arranged within the support column 809 or outside the light bulb 800.

FIG. 8 illustrates a light bulb 900 that is substantially similar in character to the light bulb 800 illustrated in connection with FIG. 8, except that the lumiphor support element 930 extends over the second electrically activated emitters 922 supported by the second emitter support element 912. The light bulb 900 includes a lateral electrical contact 992 and a foot electrical contact 991 arranged along one end thereof. At least a portion of the second emitter support element 912 may be formed of a thermally insulating material, optionally including a thermally conductive core arrangeable in thermal communication with a heatsink or other heat dissipating element (not shown). Conductive thermal communication between the first emitters 921A-921D and the second emitter 922 is limited due to the thermally insulating character of the second emitter support element 912. A lumiphor support element 930 is spatially segregated from but arranged over the second emitter 922 and is separated from the second emitter 922 via a gap 901 (which optionally may be partially filled). At least one lumiphor may be associated with the lumiphor support element 930 by dispersion, coating, or other suitable methods. The cover 950 may serve to focus, direct, scatter, mix, or otherwise affect light emitted from the electrically activated emitters 921A-921D, 922 and from the lumiphor support element 930. In one embodiment, at least a portion of the cover 950 comprises at least one additional lumiphor arranged to receive emissions from one or more of the electrically activated emitters 821A-821D and convert a portion of such emissions to at least one different peak wavelength. In one embodiment, the lumiphor support element 930 is omitted entirely, and the cover 950 comprises at least one lumiphor, with the cover 950 being spatially separated from the electrically activated emitters 921-921D, 922 via a gap 902 interior to the bulb 900. Aggregated emissions from the lighting device 900 may include numerous (e.g., three, four, five, or more) wavelength peaks, including emissions from the electrically activated emitters 921A-921D, 922 and at least one lumiphor associated with the lumiphor support element 930 and/or at least one lumiphor associated with the cover 950. Each electrically activated emitter 921A-921D, 922 may be independently controlled via one or more control circuit elements (not shown) that may be arranged within the support column 909 or outside the light bulb 900.

As an alternative to thermally insulating materials arranged between emitter support elements as described herein, such support elements may be separated by gaps devoid of (e.g., thermally insulating) material.

It is to be appreciated that any of the elements and features described herein are contemplated to be combined with any one or more other elements and features, unless indicated to the contrary herein.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A lighting device comprising:
  a plurality of electrically activated emitters including at least one first electrically activated emitter having a first peak wavelength, at least one second electrically activated emitter having a second peak wavelength, and at least one third electrically activated emitter having a third peak wavelength, wherein each of said first, second, and third peak wavelength differs from one another;
  a first lumiphor spatially segregated from and arranged to receive emissions from the at least one first electrically activated emitter;
  a first emitter support element arranged to support the at least one first electrically activated emitter; and
  a second emitter support element arranged to support the at least one second electrically activated emitter, wherein the second emitter support element is spatially segregated from, and/or is in insubstantial thermally conductive communication with, the first emitter support element;
  at least one of (i) a common reflector and (ii) a common diffuser, arranged to receive at least some emissions from each emitter of the plurality of electrically activated emitters.

2. The lighting device of claim 1, comprising a common reflector arranged to receive at least some emissions from each emitter of the plurality of electrically activated emitters.

3. The lighting device of claim 1, comprising a common diffuser arranged to receive at least some emissions from each emitter of the plurality of electrically activated emitters.

4. The lighting device of claim 1, wherein the second emitter support element is arranged non-coplanar with the first emitter support element.

5. The lighting device of claim 1, comprising a thermally insulating material disposed between the first emitter support element and the second emitter support element.

6. The lighting device of claim 1, wherein the first lumiphor is adapted to output emissions having a fourth peak wavelength that differs from each of said first, second, and third peak wavelength.

7. The lighting device of claim 1, wherein the first lumiphor is arranged to receive emissions from each emitter of the plurality of electrically activated emitters.

8. The lighting device of claim 7, comprising light scattering material associated with the first lumiphor.

9. The lighting device of claim 1, wherein each of the first, second, and third peak wavelength differs from one another by at least about 30 nm.

10. The lighting device of claim 1, wherein each of the first, second, and third peak wavelength differs from one another by at least about 50 nm.

11. The lighting device of claim 1, wherein each of the first, second, and third peak wavelength is in the visible range.

12. The lighting device of claim 1, comprising at least one of the following: the first peak wavelength is in a range of from about 380 nm to about 499 nm, the second peak wavelength is in a range of from about 596 nm to about 750 nm, and the third peak wavelength is in a range of from about 500 nm to about 559 nm.

13. The lighting device of claim 1, wherein the first lumiphor is arranged to emit at least one wavelength in a range of from about 560 nm to about 595 nm.

14. The lighting device of claim 1, wherein any of the at least one first electrically activated emitter, the at least one second electrically activated emitter, and the at least one third electrically activated emitter comprises multiple electrically activated emitters.

15. The lighting device of claim 1, wherein the at least one first electrically activated emitter includes an active region comprising a Group III-nitride material, and the at least one second electrically activated emitter includes an active region comprising a Group III-phosphide material.

16. The lighting device of claim 1, wherein the at least one third electrically activated emitter is supported by the first emitter support element.

17. The lighting device of claim 1, wherein the at least one third electrically activated emitter is supported by a third emitter support element that is spatially segregated from, and/or is in insubstantial thermally conductive communication with, the first emitter support element.

18. The lighting device of claim 1, wherein the second emitter support element is arranged between the first emitter support element and the first lumiphor, wherein at least a portion of the second emitter support element is substantially transmissive of the first peak wavelength.

19. The lighting device of claim 1, wherein the first lumiphor is arranged between the at least one first electrically activated emitter and the at least one second electrically activated emitter.

20. The lighting device of claim 1, further comprising at least one fourth electrically activated emitter having a fourth peak wavelength, and a second lumiphor arranged to receive at least some emissions from the at least one fourth electrically activated emitter.

21. The lighting device of claim 1, wherein the first lumiphor is spatially segregated from the at least one first electrically activated emitter by a distance of at least about 1 mm.

22. The lighting device of claim 1, wherein the first lumiphor is spatially segregated from the at least one first electrically activated emitter by a distance of at least about 5 mm.

23. The lighting device of claim 1, wherein the first emitter support element is spatially segregated from the second emitter support element by a distance of at least about 1 mm.

24. The lighting device of claim 1, wherein the first emitter support element is spatially segregated from the second emitter support element by a distance of at least about 5 mm.

25. The lighting device of claim 1, wherein at least one of the first emitter support element and the second emitter support element comprises a reflector arranged to receive light from at least one of the third emitter and the first lumiphor.

26. The lighting device of claim 1, comprising a reflector element defining at least one window, wherein at least a portion of at least one emitter of the plurality of electrically activated emitters extend into or through the at least one window.

27. The light device of claim 1, wherein the second emitter support element comprises a substantially transmissive material arranged to permit substantial transmission of emissions from the at least one first electrically activated emitter.

28. The lighting device of claim 1, wherein the at least one first electrically activated emitter, the at least one second electrically activated emitter, and the at least one third electrically activated emitter are independently controllable relative to one another.

29. The lighting device of claim 1, further comprising a control circuit arranged to independently apply drive current to any of the at least one first electrically activated emitter, the at least one second electrically activated emitter, and the at least one third electrically activated emitter.

30. The lighting device of claim 1, wherein each of the at least one first, the at least one second, and the at least one third electrically activated emitter comprises a light emitting diode.

31. The lighting device of claim 1, comprising a dichroic filter arranged between the at least one first electrically activated emitter and the first lumiphor.

32. The lighting device of claim 1, comprising a first heatsink in conductive thermal communication with the first emitter support element, and a second heatsink in conductive thermal communication with the second emitter support element.

33. The lighting device of claim 1, wherein one of the first emitter support element or the second emitter support element forms a tubular shape, and the other of the first emitter support element or the second emitter support element extends through an interior of the tubular shape.

34. The lighting device of claim 1, having a color rendering index of from about 90 to about 99.

35. A light bulb comprising:
a lighting device according to claim 1;
a plurality of electrical conductors in electrical communication with the plurality of electrically activated emitters; and
first and second electrical contacts arranged to mate with an electrical receptacle to receive electric current, wherein the first and second electrical contacts are in electrical communication with the plurality of electrical conductors.

36. The light bulb of claim 35, comprising at least one heatsink in conductive thermal communication with at least one of the first emitter support element and the second emitter support element.

37. A light fixture comprising a lighting device according to claim 1.

38. A light fixture comprising:
a first lighting device according to claim 1;
a second lighting device according to claim 1; and
a control circuit arranged to independently control supply of current to (a) the at least one first electrically activated emitter, (b) the at least one second electrically activated emitter, and (c) the at least one third electrically activated emitter, of the first lighting device and the second lighting device.

39. A lighting device comprising:
a plurality of electrically activated emitters including at least one first electrically activated emitter having a first peak wavelength, and at least one second electrically activated emitter having a second peak wavelength, wherein the first peak wavelength differs from the second peak wavelength;
a first emitter support element arranged to support the at least one first electrically activated emitter;
a first lumiphor spatially segregated from and arranged to receive emissions from the at least one first electrically activated emitter;
a second emitter support element arranged to support the at least one second electrically activated emitter, wherein the second emitter support element is spatially segregated from, and/or is in insubstantial thermally conductive communication with, the first emitter support element;
a second lumiphor spatially segregated from and arranged to receive emissions from the at least one second electrically activated emitter; and
at least one of (i) a common reflector and (ii) a common diffuser, arranged to receive at least some emissions from each emitter of the plurality of electrically activated emitters.

40. The lighting device of claim 39, comprising a common reflector arranged to receive at least some emissions from each emitter of the plurality of electrically activated emitters.

41. The lighting device of claim 39, comprising a common diffuser arranged to receive at least some emissions from each emitter of the plurality of electrically activated emitters.

42. The lighting device of claim 39, wherein the second emitter support element is arranged non-coplanar with the first emitter support element.

43. The lighting device of claim 39, comprising a thermally insulating material disposed between the first emitter support element and the second emitter support element.

44. The lighting device of claim 39, wherein the first lumiphor is adapted to output emissions having a third peak wavelength, the second lumiphor is adapted to output emissions having a fourth peak wavelength, and each of the first, second, third, and fourth peak wavelength differs from the other.

45. The lighting device of claim 44, wherein each of the first, second, third, and fourth peak wavelength differs from one another by at least about 30 nm.

46. The lighting device of claim 44, wherein each of the first, second, third, and fourth peak wavelength is in the visible range.

47. The lighting device of claim 39, further comprising at least one third electrically activated emitter having a peak wavelength that differs from each of the first peak wavelength and the second peak wavelength.

48. The lighting device of claim 47, wherein the first lumiphor is arranged to receive emissions from each of the at least one first electrically activated emitter and the at least one third electrically activated emitter.

49. The lighting device of claim 47, wherein the at least one third electrically activated emitter is supported by the first emitter support element.

50. The lighting device of claim 47, wherein the at least one third electrically activated emitter is supported by a third emitter support element that is spatially segregated from, and/or is in insubstantial thermally conductive communication with, the first emitter support element.

51. The lighting device of claim 39, comprising at least one of the following: the first peak wavelength is in a range of from about 380 nm to about 499 nm, and the second peak wavelength is in a range of from about 596 nm to about 750 nm.

52. The lighting device of claim 39, wherein any of the at least one first electrically activated emitter and the at least one second electrically activated emitter comprises multiple electrically activated emitters.

53. The lighting device of claim 39, wherein the at least one first electrically activated emitter includes an active region comprising a Group III-nitride material, and the at least one second electrically activated emitter includes an active region comprising a Group III-phosphide material.

54. The lighting device of claim 39, wherein the first lumiphor is arranged between the first emitter support element and the at least one second electrically activated emitter.

55. The lighting device of claim 39, wherein the first lumiphor is spatially segregated from the at least one first electrically activated emitter by a distance of at least about 1 mm.

56. The lighting device of claim 39, wherein the first lumiphor is spatially segregated from the at least one first electrically activated emitter by a distance of at least about 5 mm.

57. The lighting device of claim 39, wherein the first emitter support element is spatially segregated from the second emitter support element by a distance of at least about 1 mm.

58. The lighting device of claim 39, wherein the first emitter support element is spatially segregated from the second emitter support element by a distance of at least about 5 mm.

59. The lighting device of claim 39, wherein drive current is independently controllable to each of the least one first electrically activated emitter and the at least one second electrically activated emitter.

60. The lighting device of claim 39, wherein each of the least one first electrically activated emitter and the at least one second electrically activated emitter comprises a light emitting diode.

61. The lighting device of claim 39, comprising a first heatsink in conductive thermal communication with the first emitter support element, and a second heatsink in conductive thermal communication with the second emitter support element.

62. The lighting device of claim 39, wherein one of the first emitter support element or the second emitter support element forms a tubular shape, and the other of the first emitter support element or the second emitter support element extends through an interior of the tubular shape.

63. The lighting device of claim 39, having a color rendering index of from about 90 to about 99.

64. A light bulb comprising:
a lighting device according to claim 39;
a plurality of electrical conductors in electrical communication with the plurality of electrically activated emitters; and
first and second electrical contacts arranged to mate with an electrical receptacle to receive electric current, wherein the first and second electrical contacts are in electrical communication with the plurality of electrical conductors.

65. The light bulb of claim 64, comprising at least one heatsink in conductive thermal communication with at least one of the first emitter support element and the second emitter support element.

66. A light fixture comprising a lighting device according to claim 39.

67. A light fixture comprising:
a first lighting device according to claim 39;
a second lighting device according to claim 39; and
a control circuit arranged to independently control supply of current to (a) the at least one first electrically activated emitter, (b) the at least one second electrically activated emitter, and (c) the at least one third electrically activated emitter, of the first lighting device and the second lighting device.

68. A method of fabricating a lighting device, the method comprising:
connecting a first emitter support element and a second emitter support element via at least one thermally insulating material to form a subassembly wherein at least a portion of each of the first emitter support element and the second emitter support element is substantially coplanar;
applying at least one of a patterning step, a deposition step, and a soldering step to the at least a portion of the subassembly; and
performing at least one of a bending operation and a shaping operation to the subassembly to cause at least a portion of the second emitter support element to be non-coplanar with the first emitter support element.

69. The method of claim 68, wherein a bent or shaped portion of the second emitter support element forms a reflector of a lighting device.

70. The method of claim 68, wherein the bent or shaped portion of the second emitter support element is arranged to support a reflector element added to the lighting device.

71. The method of claim 68, comprising mounting at least one solid state emitter to the subassembly, wherein the mounting step is performed prior to the performance of at least one of a bending operation and a shaping operation.

72. The method of claim 68, further comprising applying a lumiphor support element over at least a portion of the subassembly, wherein the lumiphor support element is spatially separated from at least one solid state emitter mounted to the subassembly.

* * * * *